US005541122A

United States Patent [19]

Tu et al.

[11] Patent Number: 5,541,122

[45] Date of Patent: Jul. 30, 1996

[54] METHOD OF FABRICATING AN INSULATED-GATE BIPOLAR TRANSISTOR

[75] Inventors: Shang-Hui L. Tu, Phoenix; Gordon Tam, Gilbert; Pak Tam, Tempe, all of Ariz.

[73] Assignee: Motorola Inc., Schaumburg, Ill.

[21] Appl. No.: 415,832

[22] Filed: Apr. 3, 1995

[51] Int. Cl.[6] .................... H01L 21/265

[52] U.S. Cl. .................... 437/31; 437/6; 437/40; 437/41; 437/974; 148/DIG. 126

[58] Field of Search .................... 437/31, 6, 974, 437/40 DM, 41 DM, 29, 911; 148/DIG. 126, DIG. 135

[56] References Cited

U.S. PATENT DOCUMENTS

| | | | |
|---|---|---|---|
| 5,141,887 | 8/1992 | Liaw et al. | 437/974 |
| 5,141,889 | 8/1992 | Terry et al. | 437/31 |

OTHER PUBLICATIONS

A. Nakagawa et al., "1800V Bipolar–Mode MOSFETs: a First Application of Silicon Wafer Direct Bonding (SDB) Technique to a Power Device," 1986 IEEE IEDM Technical Dig., pp. 122–125.

H. Ohashia et al., "Study of Si–Wafer Directly Bonded Interface Effect on Power Device Characteristics," 1987 IEEE IEDM Technical Dig., pp. 678–681.

D. Kuo et al., "Optimization of Epitaxial Layers for Power Bipolar–MOS Transistor," IEEE Electron Device Letters, vol. EDL–7, No. 9, Sep. 1986, pp. 510–512.

B. Baliga et al., "The Insulated Gate Rectifier (IGR): a New Power Switching Device," 1982 IEEE IEDM, pp. 264–267.

J. Russell et al., "The Comfet—A New High Conductance MOS–Gates Device," IEEE Electron Device Letters, vol. EDL–4, No. 3, Mar. 1983, pp. 63–65.

*Primary Examiner*—Tuan H. Nguyen
*Attorney, Agent, or Firm*—Miriam Jackson

[57] ABSTRACT

A method of fabricating a fast-switching, low-R(on) insulated-gate bipolar transistor including providing an N-type semiconductor wafer with a planar surface, forming a thin heavily-doped layer, having a concentration in the range of $3\times10^{17}/cm^3$ to $1\times10^{19}/cm^3$, in the wafer adjacent the planar surface, providing a P-type semiconductor wafer, and bonding a surface of the P-type wafer to the planar surface of the N-type wafer. An emitter and a gate are then formed in the N-type wafer in the usual manner and a collector is formed on the P-type wafer.

17 Claims, 3 Drawing Sheets

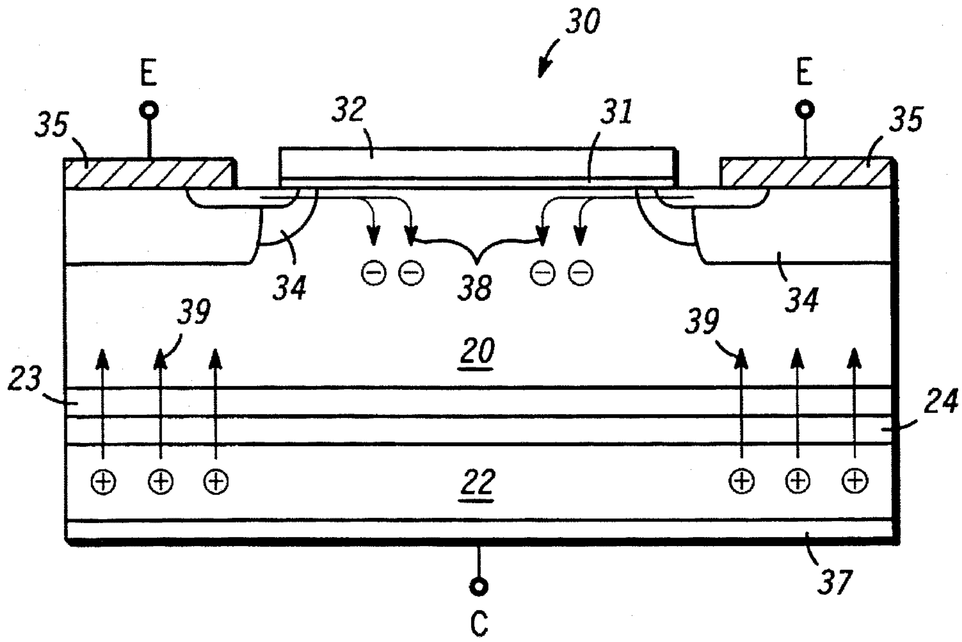
FIG. 12
FIG. 13
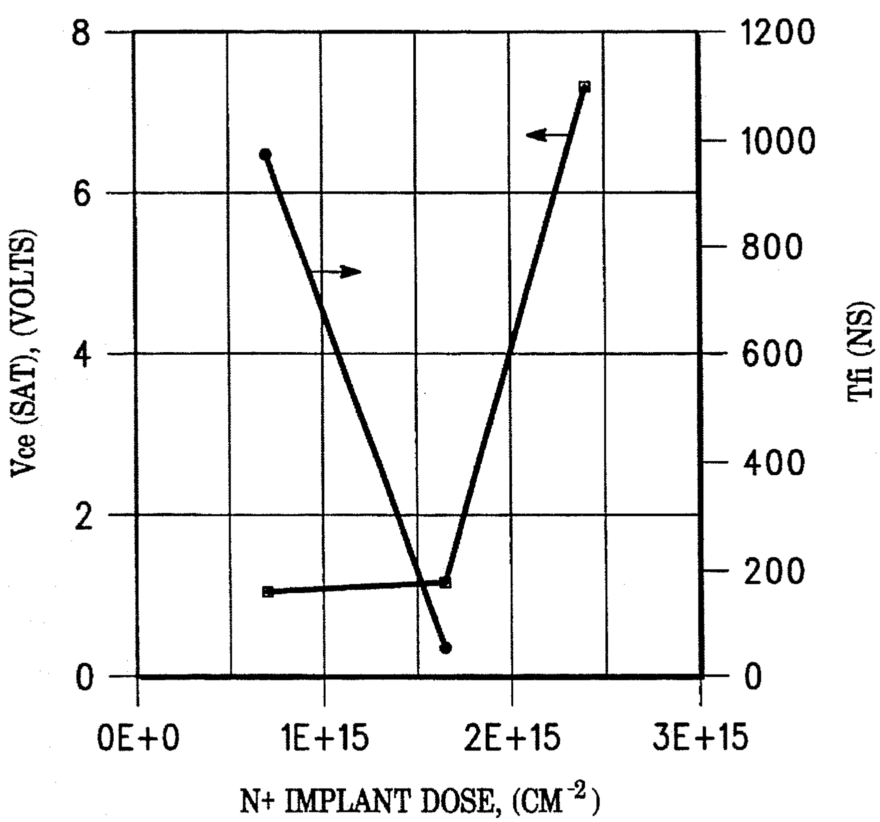

METHOD OF FABRICATING AN INSULATED-GATE BIPOLAR TRANSISTOR

The present invention pertains to insulated-gate bipolar transistors and more specifically to insulated-gate bipolar transistors which are fast switching and have a low-R (ON).

BACKGROUND OF THE INVENTION

Insulated-gate bipolar transistors (IGBT) generally include an $N^+$-type buffer region positioned between a $P^+$-type region in a substrate and an $N^-$-type drift region in the substrate. A gate and an emitter are formed in the surface of the substrate in the drift region and a collector is formed in a lower surface of the substrate in the $P^+$-type region.

In the prior art, the buffer region is formed in one of two ways: either an $N^+$-type buffer layer is epitaxially grown on a $P^+$-type substrate and an $N^-$-type drift region is then epitaxially grown on the $N^+$-type buffer layer; or a thin (10 mil) N-type wafer is used, and a P-type dopant is implanted into the back side of the wafer to form a collector.

The problem with the first method is that thin, heavily doped layers are difficult to grow epitaxially. As one example, the high temperatures required in epitaxial growth tend to alter the doping profile of previously grown layers.

The problem with the second method is that thin wafers are difficult to handle. In addition, this method produces IGBTs that are more suitable for very high voltage devices, such as 1200 voltage and 1800 voltage devices.

A major problem in the prior art is that the $N^+$-type buffer region has a doping concentration which is naturally limited by the processes to less than $1\times10^{17}/cm^3$ and a thickness of 10 to 20 microns. A doping concentration of less than $1\times10^{17}/cm^3$ is not high enough to substantially reduce the hole injection from the $P^+$-type region into the $N^-$-type drift region. As a result, a significant amount of holes still is accumulated in the drift region and the device is slow in turning OFF because of this stored charge.

To increase the switching speed of the conventional IGBTs, lifetime control techniques, such as electron irradiation must be used during the device processing. Such additional processing results in higher processing costs and lower yield. Also, electron irradiation has a tendency to damage the micro-structure of the material and reduce the useful life of the devices.

Thus, it would be advantageous to devise a fabrication method in which a buffer region is formed that substantially prevents significant amounts of holes from being accumulated in the drift region.

Accordingly, it is a purpose of the present invention to provide new and improved fast-switching, low-R(ON) insulated-gate bipolar transistors.

It is another purpose of the present invention to provide new and improved methods of fabricating fast-switching, low-R(ON) insulated-gate bipolar transistors.

It is yet another purpose of the present invention to provide new and improved methods of fabricating fast-switching, low-R(ON) insulated-gate bipolar transistors which are more controllable and reproducible.

It is a further purpose of the present invention to provide new and improved methods of fabricating fast-switching, low-R(ON) insulated-gate bipolar transistors which do not require the use of lifetime control techniques, such as electron irradiation, during the device processing.

SUMMARY OF THE INVENTION

The above problems and others are at least partially solved and the above purposes and others are realized in a novel method of fabricating a fast-switching, low-R(on) insulated-gate bipolar transistor. The novel method includes providing a first semiconductor wafer with a planar surface and forming a Thin heavily-doped layer in the wafer adjacent the planar surface. A second semiconductor wafer, is also provided and a surface of the second wafer is bonded to the planar surface of the first wafer. An emitter and a gate are then formed in the first wafer in the usual manner and a collector is formed on the second wafer.

In a specific embodiment of the novel method, a first semiconductor wafer with a planar surface is provided and a thin heavily-doped layer is implanted in the first wafer adjacent the planar surface. A second semiconductor wafer with a planar surface is also provided and a thin heavily-doped layer is implanted in the second wafer adjacent the planar surface. The planar surface of the second wafer is bonded to the planar surface of the first wafer to form a buffer region therebetween with at least a portion of the buffer region forming a heavily doped layer (with a concentration in the range of $3\times10^{17}/cm^3$ to $1\times10^{19}/cm^3$) less than approximately 10 microns thick. An emitter and a gate are then formed in the first wafer after the first wafer is thinned to the desired thickness according to the voltage requirement in the usual manner and a collector is formed on the second wafer.

BRIEF DESCRIPTION OF THE DRAWINGS

Referring to the drawings:

FIG. 12 illustrates a simplified cross-sectional view of a complete IGBT fabricated in accordance with the present invention; and FIG. 13 graphically illustrates ON-state voltage drop and turn-OFF time versus buffer region doping dosage.

DESCRIPTION OF THE PREFERRED EMBODIMENTS

Figure 1:
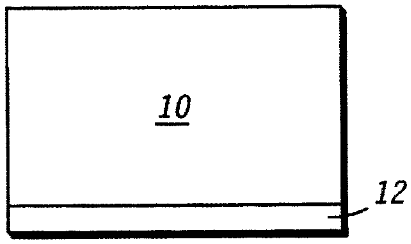
FIGS. 1–3 illustrate in a simplified form the major steps in a process of fabricating an IGBT in accordance with the present invention.
Figure 2:
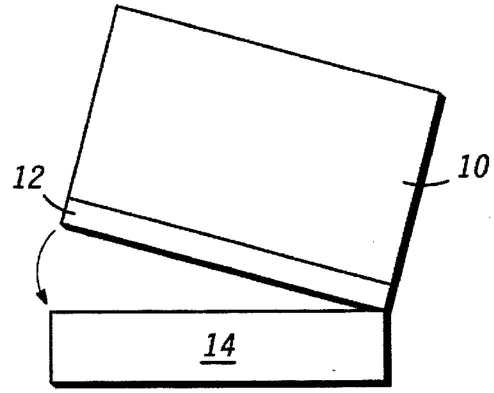
Figure 3:
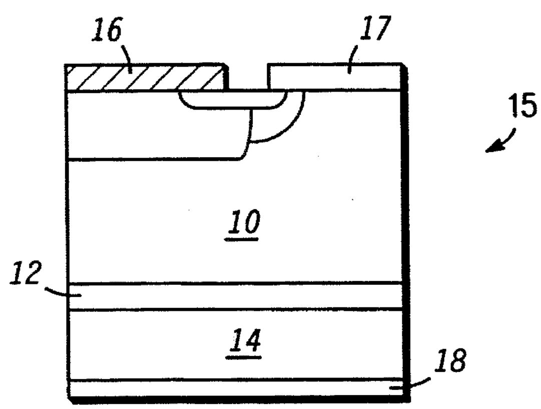

Turning now to the drawings, attention is first directed to FIGS. 1 through 3 which illustrate in a simplified form the major steps in a process of fabricating an IGBT in accordance with the present invention. Referring specifically to FIG. 1, a first wafer 10 is provided which is doped to produce a first type of conductivity. First wafer 10 has a thin heavily doped buffer region 12 formed adjacent the lower surface by implanting a convenient impurity. In specific applications, other methods may be utilized to form heavily doped buffer region 12 including diffusing, epitaxial growth, etc. However, it has been found that ion implantation can form a more reproducible and controllable, heavily-doped buffer region.

In the specific embodiment illustrated, first wafer 10 is a silicon wafer with an $N^-$-type conductivity and a thin heavily doped $N^+$-type buffer region 12 formed adjacent the lower surface by implanting an N-type dopant, such as phosphorus.

Referring specifically to FIG. 2, a second wafer 14 with a second type of conductivity is provided. In the specific embodiment illustrated, second wafer 14 is a silicon wafer with a $P^+$-type conductivity. The lower surface of wafer 10 is planar and the upper surface of wafer 14 is planar and they are placed together and wafer bonded to form a single integral unit with $N^+$-type buffer region 12 sandwiched between first wafer 10 and second wafer 14. Because the bonding step can be performed at relatively low temperatures, the $N^+$profile of buffer region 12 is preserved and a thin buffer region 12 with a doping concentration of approximately $3\times10^{17}/cm^3$ to $1\times10^{19}/cm^3$ is the result. Most preferably, a buffer region 12 having a doping concentration of approximately $3\times10^{17}/cm^3$ to $3\times10^{18}/cm^3$ is believed to form devices having optimum electrical characteristics without process variability and with a high degree of manufacturability using standard equipment.

An IGBT 15 is illustrated in FIG. 3 wherein a source contact 16 and gate 17 are formed in the upper surface of wafer 10 and a collector 18 is formed on the lower surface of wafer 14. As a result of the novel method of fabricating IGBT 15, buffer region 12 is formed very thin, less than approximately 10 microns, and the doping concentration is substantially increased, with a doping concentration of $3\times10^{17}/cm^3$ to $1\times10^{19}/cm^3$, which results in optimal device performance. Further, because of thin, heavily doped buffer region 12, no other lifetime control is needed.

Figure 4:
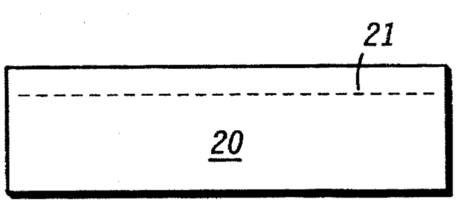
FIGS. 4–11 illustrate various steps in a specific embodiment of the novel process.

Turning now to FIGS. 4 through 11, a specific embodiment of the novel process is illustrated for exemplary purposes, which embodiment includes several more detailed steps. Referring specifically to FIG. 4, a first wafer 20 with $N^-$-type doping is provided. A dose of approximately $5\times10^{14}$to $1\times10^{16}/cm^2$ of phosphorous is implanted adjacent the upper surface of wafer 20 at an energy of approximately 40–120 KeV. While specific types of implants are described herein for purposes of explanation, those skilled in the art will understand that any conventional implants (e.g. arsenic, antimony, etc.) which fulfill the purposes can be utilized.

Figure 5:
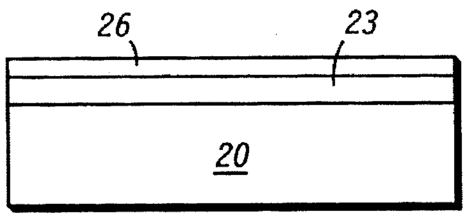

After the implanting step, wafer 20 is annealed to activate the implant as shown in FIG. 5. Generally, the anneal step is performed at a temperature ranging from 900° to 1100° C. for a time in the range of 30 to 90 minutes. The annealing step forms an $N^+$-type layer 23 in wafer 20. Basically, as is understood by those skilled in the art, the annealing step controls the doping concentration and the thickness of the doped layer 23. The annealing step also, incidentally, forms an oxide layer 26 on the upper surface of wafer 20, as illustrated in FIG. 5. In an anneal step performed at approximately 1080° C., oxide layer 26 is approximately 415 angstroms thick.

Figure 6:
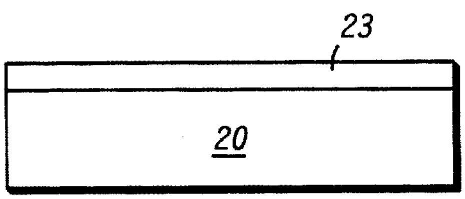

Continuing the process flow in FIG. 6, wafer 20 is wet etched to remove oxide layer 26, and any other materials that may have been deposited or accumulated, and to expose the upper surfaces of wafer 20. Typically, a buffered oxide etch (BOE) type etch using a 10:1 etchant is performed at approximately 30° C. for approximately 55 seconds. It will of course be understood that other etchants may be utilized and the time is dependent upon the thickness of oxide layer 26. In some cases it may be desirable to also etch back one or both of the surfaces of wafer 20 and wafer 22 (shown in FIG. 9) to further reduce the thickness of layer 23 and/or the thickness of layer 24 (shown in FIG. 9).

Figure 7:
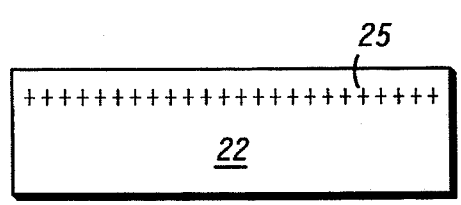

Referring specifically to FIG. 7, a second wafer 22 with $P^+$-type doping is provided. A dose of approximately $1\times10^{15}$ to $1\times10^{16}/cm^2$ of boron is implanted adjacent the upper surface of wafer 22 at an energy of approximately 40–120 KeV. While the present structure can be formed with only one layer as the buffer region, it has been found that the boron implant improves reproducibility and control to the process. It is believed that this occurs because the boron implant moves the bond interface away from the P-N junction formed by the buffer region and the $P^+$-type region of wafer 22, which in turn moves the electrical junction away from the bonding interface into layer 23 of wafer 20.

Figure 8:
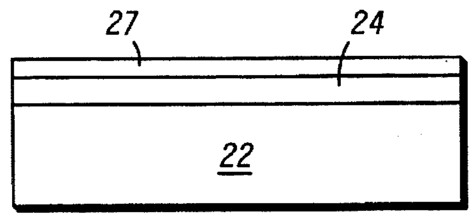

After the implanting step, wafer 22 is annealed to activate the implant. Generally, the anneal step is performed at a temperature ranging from 900°–100° C. for a time in the range of 30 to 90 minutes. The annealing step forms a $P^+$-type layer 24 in wafer 22. Basically, as is understood by those skilled in the art, the annealing step controls the doping concentration and the thickness of the doped layer 24. The annealing step also, incidentally, forms an oxide layer 27 on the upper surface of wafer 22, as illustrated in FIG. 8. In an anneal step performed at approximately 1080° C., oxide layer 27 is approximately 415 angstroms thick.

Figure 9:
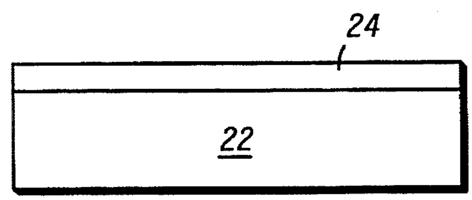

Continuing the process flow in FIG. 9, wafer 22 is wet etched to remove oxide layer 27, and any other materials that may have been deposited or accumulated, and to expose the upper surfaces of wafer 22. Typically, a BOE type etch using a 10:1 etchant is performed at approximately 30° C. for approximately 55 seconds. It will of course be understood that other etchants may be utilized and the time is dependent upon the thickness of oxide layer 27. In some cases it may be desirable to also etch back one or both of the surfaces of wafers 20 or 22 to further reduce the thickness of layer 23 and/or the thickness of layer 24 as described above with reference to FIG. 6.

Figure 10:
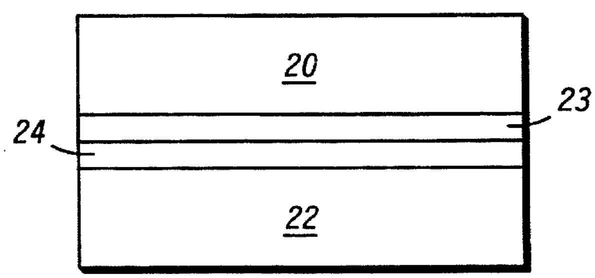

Now referring to FIG. 10, with the upper surfaces of wafers 20 and 22 exposed, the upper surfaces are placed together (inverting wafer 20) and bonded by any standard wafer bonding technique. In this specific example, wafers 20 and 22 are simply joined together at room temperature and then heated to a temperature of approximately 1050° C. for approximately 60 minutes. This causes the surfaces to bond together to form a single integral unit. The anneal temperature can be in the range of 800° to 1100 ° C.

Figure 11:
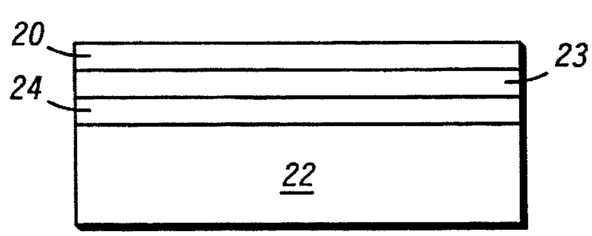

Referring now to FIG. 11, with wafers 20 and 22 bonded to form an integral unit, upper wafer 20 is lapped or polished to a desired thickness, which in this specific embodiment is approximately 50 microns. The thickness of wafer 20 is determined according to the device breakdown voltage requirement or specification. The $N^-$-type upper region of wafer 20 defines a drift region for the IGBT.

As illustrated in FIG. 12, a gate 30 is formed on the upper surface of wafer 20 using a typical method, generally by depositing an insulating layer 31 and placing a gate electrode 32 thereon. Using gate 30 as a mask various implants or diffusions 34 are made adjacent the surface of the drift region to define an emitter/collector encircling gate 30. An emitter contact 35 is deposited on the diffusions 34 using a typical method and a collector contact 37 is deposited on the lower surface of wafer 22 using normal techniques.

When appropriate potentials are applied to gate 32, emitter 35, and collector 37, electrons are injected into the drift region through the gate region by emitter 35 (as illustrated in FIG. 9, by arrows 38) and holes are injected into the drift region by collector 37 (as illustrated in FIG. 9, by arrows 39) to provide the desired bipolar transistor current. Because layers 23 and 24, defining the buffer region, are very thin and heavily doped, with a doping concentration of approximately $3\times10^{17}/cm^3$ to $1\times10^{19}/cm^3$, the concentration is high enough to reduce the hole injection from the $P^+$-type region into the $N^-$-type drift region. As a result, no Significant amount of holes are accumulated, stored charge is reduced substantially in the drift region and the device can be turned OFF very rapidly. In addition, to reduce stored charge in the drift region, the buffer region having a higher concentration and the presence of a bonding interface can reduce the lifetime of electron/hole carriers. As a result, holes accumulated in the drift region can be removed at a faster rate.

This result is apparent from the graphical illustration in FIG. 13 of the ON-state voltage drop (Vce(sat)) and turn-OFF time (Tfi) versus buffer region doping dosage. For example, in conventional IGBTs with additional lifetime control the turn-OFF time is approximately 200 nanoseconds while the turn-OFF time in the present novel structure is less than approximately 80 nanoseconds. The curve with the arrow pointing to the right illustrates the change in Tfi with N+ implant dose and the curve with the arrow pointing to the left illustrates the change in Vce(sat) with N+ implant dose.

Thus, a new and improved fast-switching, low-R(ON) insulated-gate bipolar transistor has been disclosed along with new and improved methods of fabricating fast-switching, low-R(ON) insulated-gate bipolar transistors. In addition to producing semiconductor device with better performance characteristics, the new and improved methods of fabricating fast-switching, low-R(ON) insulated-gate bipolar transistors are more controllable and reproducible. Also, the new and improved methods of fabricating fast-switching, low-R(ON) insulated-gate bipolar transistors do not require the use of lifetime control techniques, such as electron irradiation, during the device processing, which further reduces costs and improves reproducibility and eliminates the possibility of damaging the micro-structure of the devices.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating an insulated-gate bipolar transistor comprising the steps of:

providing a substrate having a first conductivity type with a planar surface;

forming a heavily-doped layer of the first conductivity type, having a concentration in a range of $3\times10^{17}/cm^3$ to $1\times10^{19}/cm^3$, in the substrate adjacent the planar surface;

providing a layer of semiconductor material with a second conductivity type having first and second opposed surfaces;

bonding the first surface of the layer of semiconductor material to the planar surface of the substrate, so that the heavily doped layer of the first conductivity type is adjacent the layer of the semiconductor material having a second conductivity type; and forming an emitter and a gate on the second surface of the semiconductor layer.

2. A method of fabricating an insulated-gate bipolar transistor as claimed in claim 1 wherein the step of forming a heavily-doped layer includes implanting impurities and annealing to activate the impurities.

3. A method of fabricating an insulated-gate bipolar transistor as claimed in claim 2 wherein the step of implanting impurities includes implanting phosphorous.

4. A method of fabricating an insulated-gate bipolar transistor as claimed in claim 3 wherein the step of implanting phosphorous includes implanting a dose of approximately $5\times10^{14}$ and $1\times10^{16}/cm^2$ phosphorous.

5. A method of fabricating an insulated-gate bipolar transistor as claimed in claim 2 including in addition a step of implanting impurities of the second conductivity type in the layer of semiconductor material adjacent the first surface and annealing to activate the impurities.

6. A method of fabricating an insulated-gate bipolar transistor as claimed in claim 5 wherein the step of annealing is performed at a temperature of approximately 1080° C.

7. A method of fabricating an insulated-gate bipolar transistor as claimed in claim 5 wherein the step of implanting impurities in the layer of semiconductor material includes implanting boron.

8. A method of fabricating an insulated-gate bipolar transistor as claimed in claim 7 wherein the step of implanting boron includes implanting a dose of approximately $1\times10^{15}$ to $1\times10^{16}/cm^2$ boron wherein an electrical junction is formed in a portion of the semiconductor material.

9. A method of fabricating an insulated-gate bipolar transistor as claimed in claim 5 including in addition a step of removing any additional material formed on the planar surface of the substrate and the first surface of the layer of semiconductor material by the annealing step prior to the step of bonding the first surface of the layer of semiconductor material to the planar surface of the substrate.

10. A method of fabricating an insulated-gate bipolar transistor as claimed in claim 9 wherein the step of bonding the first surface of the layer of semiconductor material to the planar surface of the substrate includes wafer bonding at a temperature of approximately 900°–1100° C. for approximately 30–90 minutes.

11. A method of fabricating an insulated-gate bipolar transistor as claimed in claim 9 wherein the step of forming the heavily-doped layer includes forming the layer less than approximately 10 microns thick.

12. A method of fabricating an insulated-gate bipolar transistor comprising the steps of:

providing a first semiconductor wafer having a first conductivity type with a planar surface and a second opposed surface;

forming a first heavily-doped layer of the first conductivity type in the first semiconductor wafer adjacent the planar surface;

providing a second semiconductor wafer having a second conductivity type with a planar surface and a second opposed surface;

forming a second heavily-doped layer in the second semiconductor wafer adjacent the planar surface;

bonding the planar surface of the first semiconductor wafer to the planar surface of the second semiconductor wafer to form a buffer region including the first and second heavily doped layers; and forming an emitter and a gate on the second opposed surface of the first semiconductor wafer and a collector on the second opposed surface of the second semiconductor wafer.

13. A method of fabricating an insulated-gate bipolar transistor as claimed in claim 12 wherein the step of forming a first heavily-doped layer in the first semiconductor wafer includes implanting a dose of approximately $5\times10^{14}$ to $1\times10^{16}/cm^2$ of phosphorous.

14. A method of fabricating an insulated-gate bipolar transistor as claimed in claim 13 wherein the step of forming a second heavily-doped layer in the second semiconductor wafer includes implanting a dose of approximately $1\times10^{15}$ to $1\times10^{16}/cm^2$ of boron.

15. A method of fabricating an insulated-gate bipolar transistor as claimed in claim 14 wherein the step of bonding the wafers to form the buffer region includes etching the planar surfaces of both the first and second semiconductor wafers to remove any material formed on the surface during the implanting step.

16. A method of fabricating an insulated-gate bipolar transistor as claimed in claim 15 wherein the step of etching the planar surfaces of both the first and second semiconductor wafers includes etching sufficiently to form a layer of semiconductor material during the bonding step of less than approximately 10 microns thick.

17. A method of fabricating an insulated-gate bipolar transistor as claimed in claim 16 including in addition a step of lapping the planar surface of the first semiconductor wafer, subsequent to the bonding step and before the step of forming an emitter and a gate, to form a bonded wafer having a specific thickness.

* * * * *